United States Patent
Wei et al.

(10) Patent No.: US 6,758,713 B2
(45) Date of Patent: Jul. 6, 2004

(54) PACKAGE METHOD AND APPARATUS FOR ORGANIC ELECTRO-LUMINESCENT DISPLAY

(75) Inventors: Mao-Kuo Wei, Hsinchu (TW); Yung-Wei Lai, Hsinchu (TW)

(73) Assignee: RiTdisplay Corporation, Hsinchu (TW)

(*) Notice: Subject to any disclaimer, the term of this patent is extended or adjusted under 35 U.S.C. 154(b) by 78 days.

(21) Appl. No.: 10/063,976

(22) Filed: May 30, 2002

(65) Prior Publication Data

US 2002/0193035 A1 Dec. 19, 2002

(30) Foreign Application Priority Data

Jun. 14, 2001 (TW) ........................................ 90114375 A

(51) Int. Cl.[7] .............................................. H05B 33/10
(52) U.S. Cl. ............................ 445/24; 445/66; 156/67; 156/379.8
(58) Field of Search ............................. 445/24, 66, 25; 156/67, 379.8, 539, 556, 381, 382

(56) References Cited

U.S. PATENT DOCUMENTS

| | | | |
|---|---|---|---|
| 4,431,923 A | * 2/1984 | Wang et al. | 250/491.1 |
| 5,326,420 A | * 7/1994 | Vinouze et al. | 156/379 |
| 5,811,177 A | 9/1998 | Shi et al. | 428/209 |
| 5,882,761 A | 3/1999 | Kawami et al. | 428/69 |
| 5,936,253 A | * 8/1999 | Sugaya | 250/548 |
| 5,962,962 A | 10/1999 | Fujita et al. | 313/412 |
| 6,049,167 A | * 4/2000 | Onitsuka et al. | 313/512 |

* cited by examiner

Primary Examiner—Kenneth J. Ramsey
(74) Attorney, Agent, or Firm—Jiang Chyun IP Office

(57) ABSTRACT

A package method for an organic electro-luminescent display, which spreads a certain amount of ultra-violet curing resin or thermal curing resin on a lamination plate or a substrate, to obtain a global spreading effect by forming a trench at an of the lamination plate. The lamination plate with the trench at the edge thereon is provided by a lamination plate supply system. The lamination plate is aligned and laminated with the substrate, and ultra-violet light radiation or thermal process is performed for curing the ultra-violet or thermal curing resin, respectively. In the alignment and lamination process, the space between the lamination plate and the substrate is controlled by adjusting lamination pressure and movement of the lamination machine; thereby, the exceeding ultra-violet or thermal curing resin flows into the trench at the edge of the lamination plate, and dimension of the package can thus be controlled.

20 Claims, 8 Drawing Sheets

PACKAGE METHOD AND APPARATUS FOR ORGANIC ELECTRO-LUMINESCENT DISPLAY

CROSS REFERENCE TO RELATED APPLICATIONS

This application claims the priority benefit of Taiwan application serial no. 90114375, filed Jun. 14, 2001.

BACKGROUND OF INVENTION

1. Field of the Invention

The invention relates in general to a package method for an organic electro-luminescent (OEL) display, which applies a certain amount of ultra-violet (UV) or thermal curing resin on a lamination plate or a substrate and obtains a global application by forming a trench at an edge of the lamination plate.

2. Description of the Related Art

In the conventional package method of OEL display, a frame sealant is formed using a syringe to spread a UV curing resin around a device under an inert gas (nitrogen or argon) environment. In this way, the substrate and the lamination plate are adhered together to protect the device from being corroded by moisture. The frame sealant, however, made of polymer, cannot perfectly prevent permeation of moisture, so that the commercial requirement in lifetime cannot be achieved. Studies in thin film structure, material and package process of packages for electro-luminescent display devices have been commenced by a lot of companies and researchers. The research of package process has focused on disposing drying agent or moisture absorber into the device or electroplating one or several layers of protection films on the device structure.

In terms of disposing moisture absorber inside of the device, Idemitsu Kosan filed a package method patent in 1995 (U.S. Pat. No. 5,962,962). In this package method, inert liquid layer mixed with drying agent is formed inside the device. In another package method disclosed in U.S. Pat. No. 5,882,761 by Pioneer, a metal lamination plate with a recess is used, and a drying substance is applied into the recess. Thereby, the moisture permeating into the device is absorbed, and the device lifetime is lengthened. The purpose for depositing one or several protection films on the device structure is to completely block the moisture in the external environment to permeate into the device. In this regard, protection films made of organic and inorganic materials have been discussed. For example, Motorola disclosed a patent of protection film in 1995 (U.S. Pat. No. 5,811,177), in which inert metal, inorganic protection film and resin sealant are coated on the device structure.

Referring to FIG. 1 and FIG. 2, the R.O.C Patent No. 87117618 issued to Highlight Optoelectronics Inc. disclosed a package method, which applies a screen printing process to coat a UV curing resin 106 on a lamination plate 104. A substrate 100 comprising an OEL display 102 thereon is then aligned with the lamination plate 104. By pressure and thermal processes, the package of the OEL display 102 is complete.

The above screen printing process for coating the UV curing resin on the lamination requires frequent change and cleaning of printing boards. Therefore, a mass production under an inert gas environment cannot be achieved by such method.

In addition, microscopically, the UV curing resin coated on the lamination plate by screen printing process has an uneven surface. During lamination process of the lamination plate and the substrate, bubbles are likely produced near the surface of the OEL display. Further, the dimension of the UV curing resin is difficult to control during the lamination process.

SUMMARY OF INVENTION

The present invention provides a package method for an organic electro-luminescent (OEL) display. By applying a certain amount of UV curing resin or thermal curing resin on either a lamination plate or a substrate, and by forming a trench at an edge of a lamination plate, a global coating effect can be obtained. Consequently, the adhesion between the UV or thermal curing resin, the lamination plate, and the substrate is significantly improved. Further, the dimension of the UV or thermal curing resin can be precisely controlled.

By obtaining the global coating effect, the package method for an OEL display mentioned allows mass production under an inert gas environment.

Accordingly, the present method provides a package method and a package apparatus for an OEL display. A panel on which an OEL display is formed is provided by a panel supply system. A lamination plate is provided by a lamination plate supply system. A UV or thermal curing resin is coated on either the lamination plate or the panel. The lamination plate and the panel are aligned and laminated with each other. By applying a UV radiation or a thermal process, the UV or thermal resin is cured to form a frame sealant between the panel and the lamination plate. In the alignment and lamination process, the space dimension between the panel and the lamination plate is controlled by adjusting lamination pressure and movement of the lamination machine. The exceeding UV or thermal resin flows into the trench at the edge of the lamination plate, so that the dimension thereof is well controlled. The coating pattern of the UV or thermal curing resin includes dots, circles, rectangles, parallel straight lines, cross lines, or a tree pattern. The shape of the trench includes a continuous grooves or multiple broken straight grooves distributed at the edge of the lamination plate, such that the function for controlling dimension of the UV or thermal curing resin can be achieved.

Both the foregoing general description and the following detailed description are exemplary and explanatory only and are not restrictive of the invention, as claimed.

DETAILED DESCRIPTION

First Embodiment

Referring to FIG. 3 and FIGS. 6A to 6F, a panel 200 is provided by a panel supply system. The panel 200 includes a transparent glass substrate, on which an OEL display 202 is disposed. A sealing agent 208 is coated on the OEL display 202 using a sealing agent coating system. For example, a syringe is used to extrude a certain amount of the sealing agent 208 on the OEL display 202. The pattern of the extruded sealing agent 208 includes dots, circles, rectangles, parallel stripes, cross lines, or a tree-like pattern (as shown in FIGS. 6A to 6F). The operation mechanism of the syringe includes gas adjustment or screw thrusting. The sealing agent 208 includes a UV curing resin or a thermal curing resin. By squeezing one or more syringes of the sealing agent coating system, the sealing agent 208 is coated on a surface of the OEL display 202. Thereby, the amount of the sealing agent 208 can be precisely controlled, while the coated sealing agent 208 does not contain bubbles on a surface thereof to affect the package reliability of the OEL display 202.

Figure 7A:
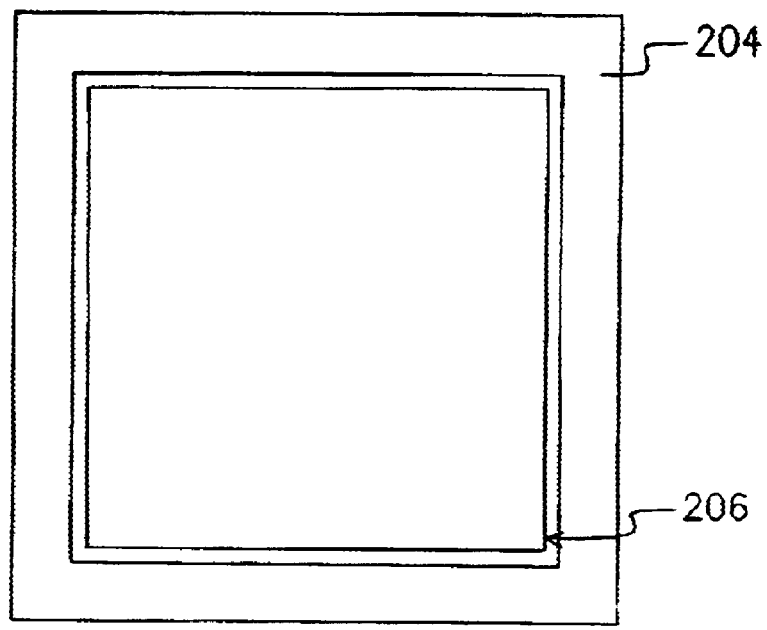
FIG. 7A to FIG. 7C show the patterns of the trench at the edge of the lamination plate.
Figure 7B:
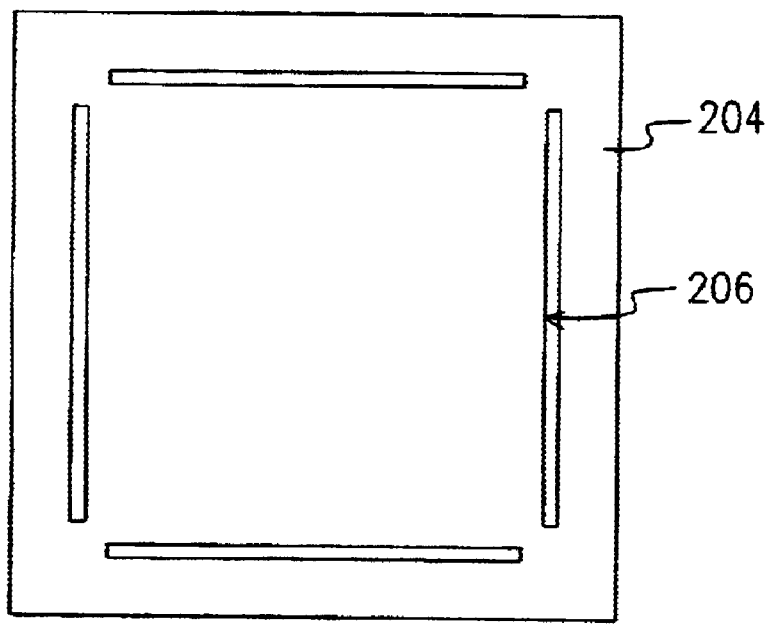
Figure 7C:
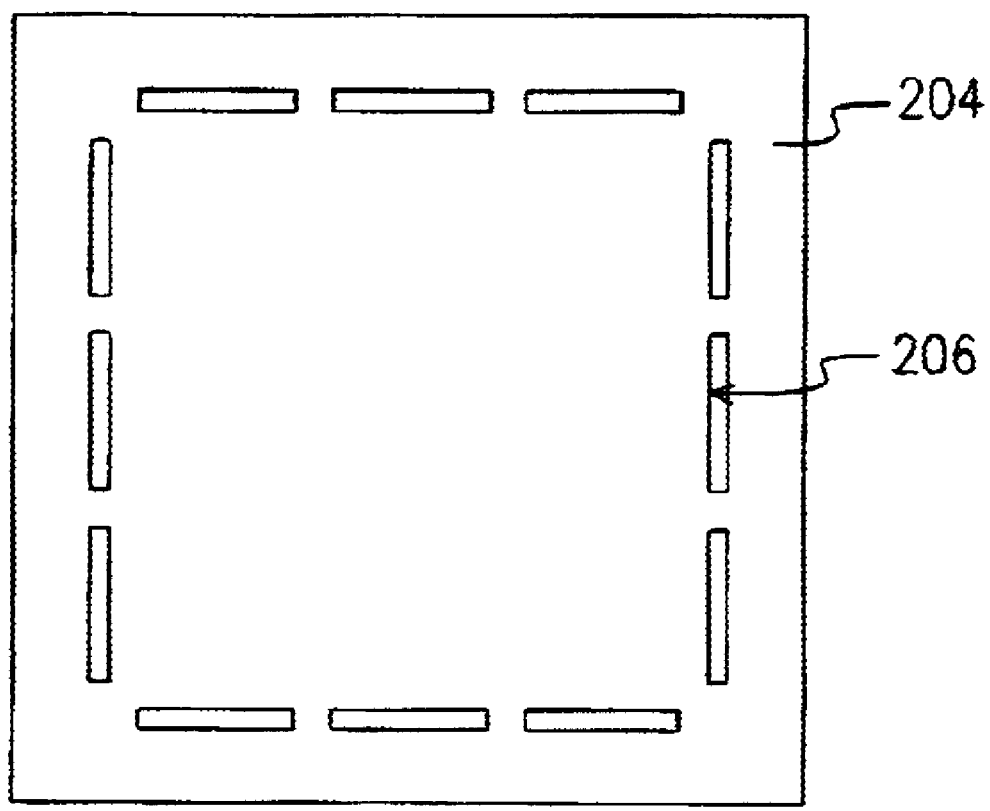

Referring to FIG. 4 and FIGS. 7A to 7C, a lamination plate 204 is provided by a lamination plate supply system. The material of the lamination plate includes glass, while a trench 206 is formed at an edge thereof to prevent overflow of the sealing agent after a subsequent lamination process. The trench 206 on the lamination plate 204 has a width of about 0.05 mm to about 1.5 mm, and a depth of about 0.01 mm to about 1.7 mm. The method for forming the trench 206 includes sand shot, turnery, supersonic drill or chemical etching. In addition, the arrangement of the trench 206 includes a continuous frame (as shown in FIG. 7A), or several broken straight ditches (as shown in FIGS. 7B and 7C). In an alignment and lamination system, the lamination plate 204 is reversed to align with the panel 200. The alignment method includes a mechanical alignment or using an optical charge-couple device alignment.

Figure 1:
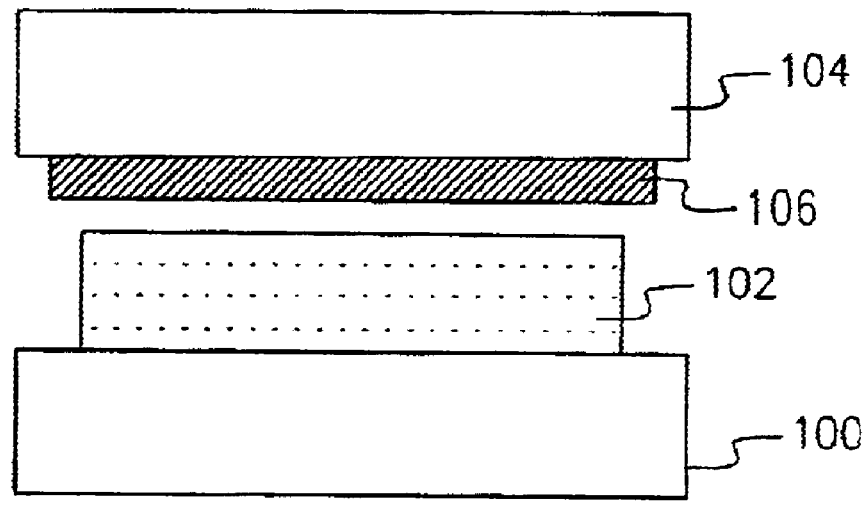
FIG. 1 and FIG. 2 show the process flow of a conventional package method for an organic electro-luminescent display.
Figure 2:
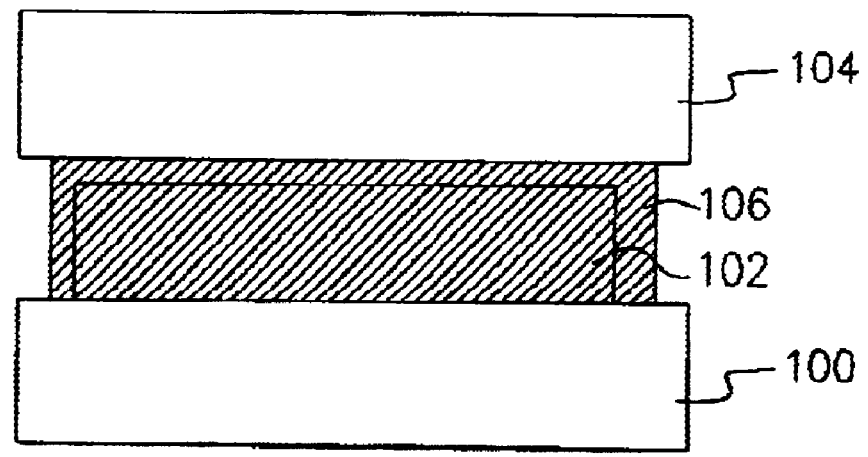
Figure 3:
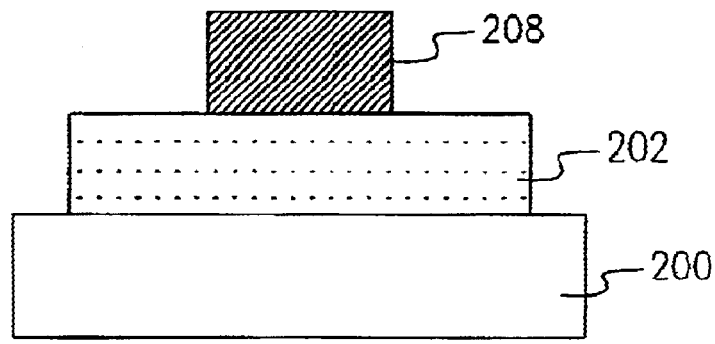
FIG. 3 to FIG. 5 show the process flow of a package method applied to an organic electro-luminescent display in a first embodiment of the invention.
Figure 4:
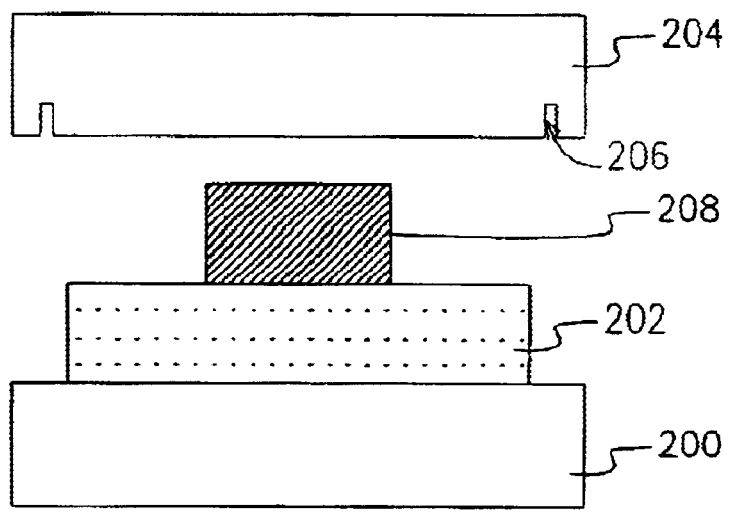
Figure 5:
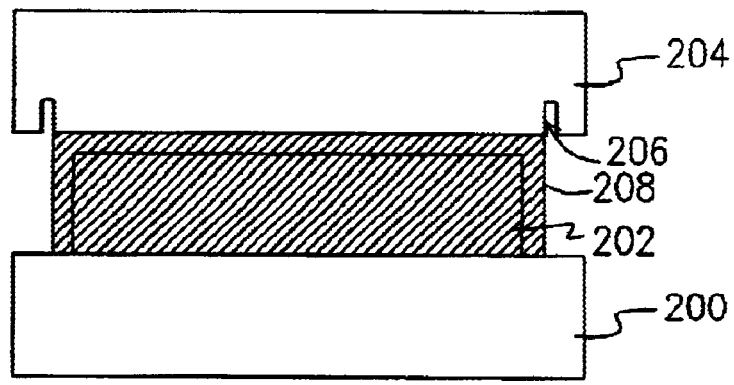
Figure 6A:
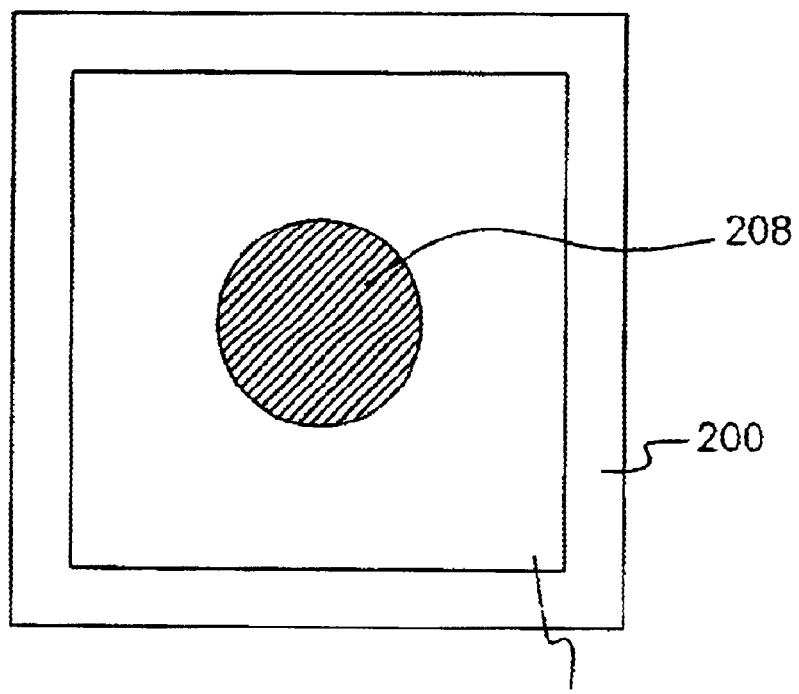
FIG. 6A to FIG. 6F show the coating patterns of UV or thermal resin.
Figure 6B:
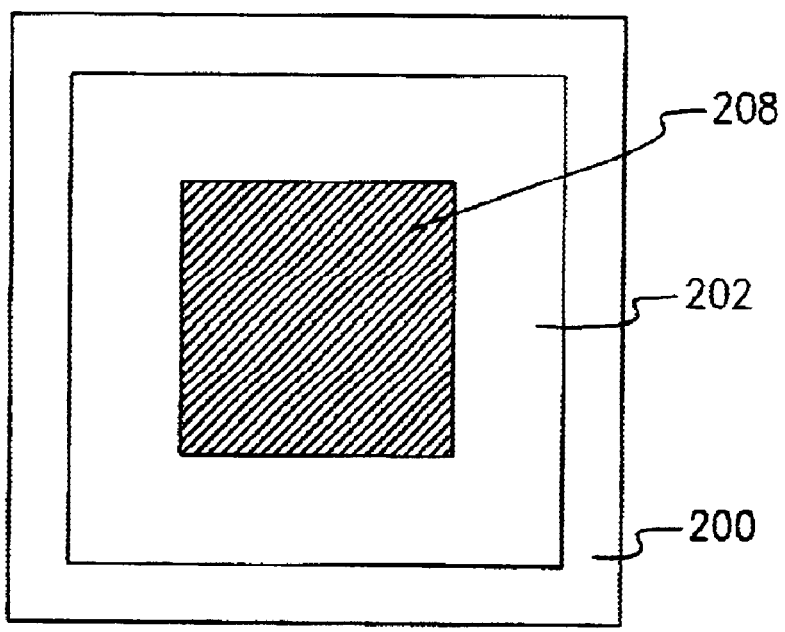
Figure 6C:
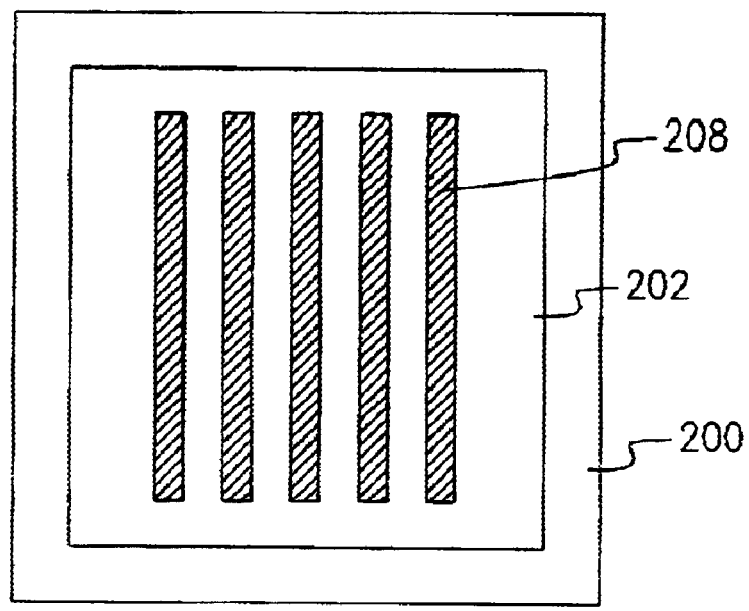
Figure 6D:
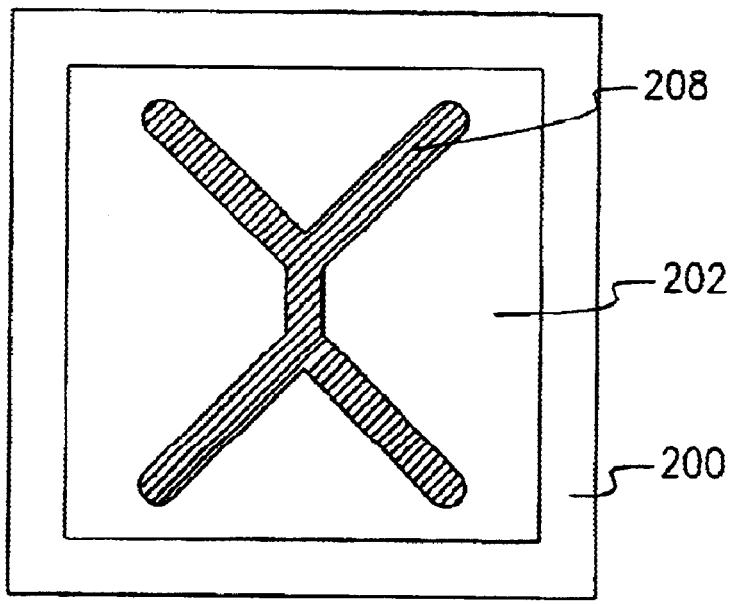
Figure 6E:
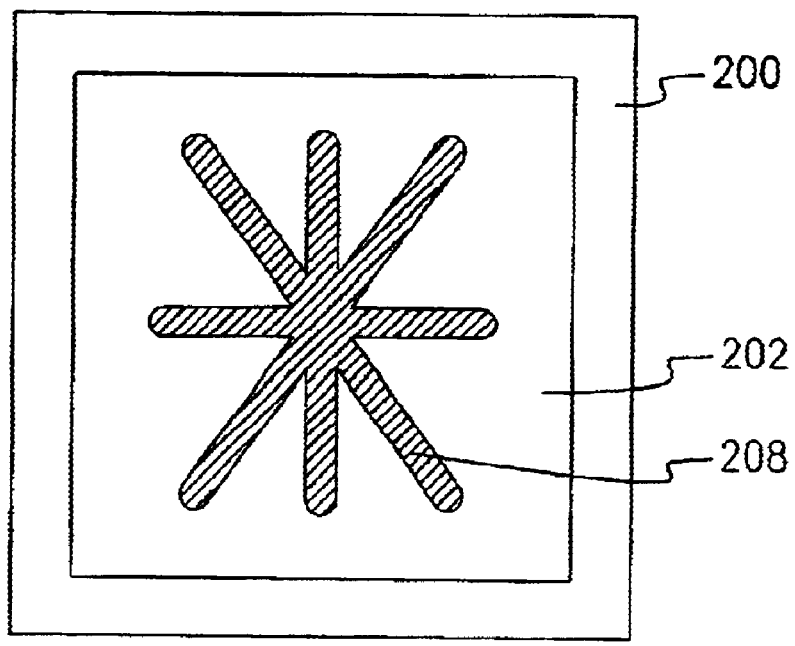
Figure 6F:
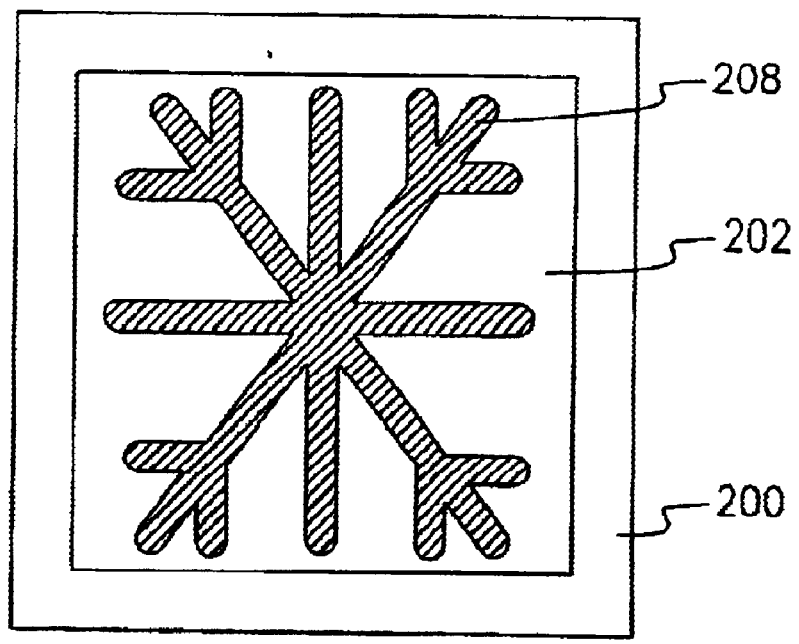

Referring to FIG. 5, after the alignment of the lamination plate 204 and the panel 200, a pressure is gradually applied to the lamination plate 204, such that the sealing agent 208 on the OEL display 202 gradually moves outward, while the moving range thereof is confined by the trench 206. The exceeding sealing agent 208 flows into the trench 206, and the sealant agent 208 is globally distributed on the OEL device 202. Therefore, the dimension of the sealing agent 208 is effectively controlled without the overflow problem, and the external width between the device to the external is increased to reduce the speed of moisture permeation Further referring to FIG. 5, a sealing agent curing system is used to cure the UV or thermal curing resin after lamination of the lamination plate 204 and the panel 200. When a UV curing resin is selected, a UV radiation is applied thereon. When a thermal curing resin is used, a thermal process is performed.

Second Embodiment

Figure 8:
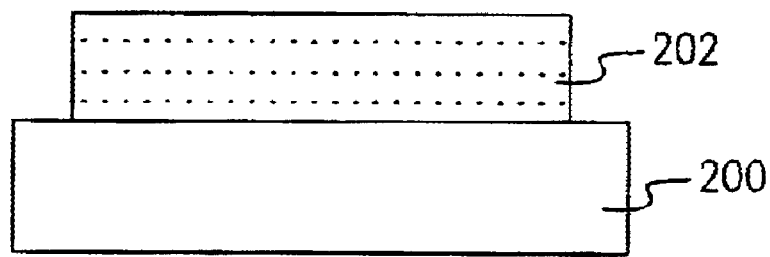
FIG. 8 to FIG. 10 show the process flow of a package method applied to an organic electro-luminescent display in a second embodiment of the invention
Figure 9:
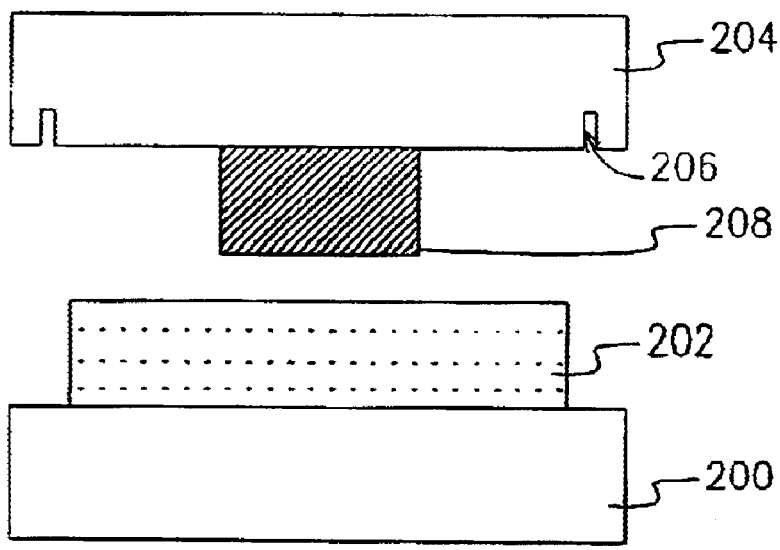
Figure 10:
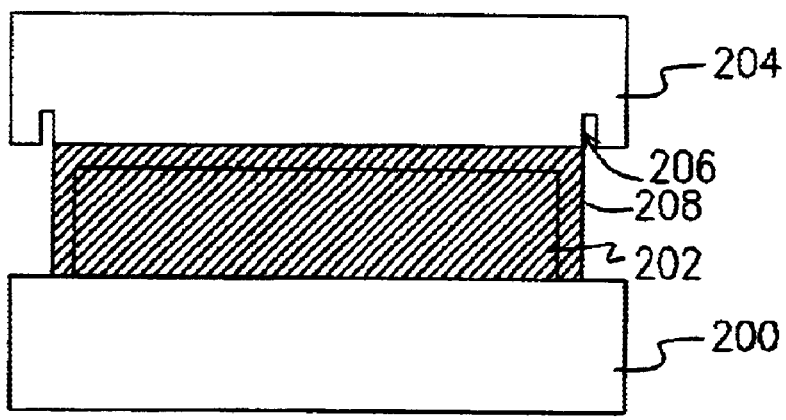

Referring to FIGS. 8 to 10, the process flow of a package method for an OEL display in a second embodiment of the invention is shown. A panel 200 is provided by a panel supply system. The panel 200 includes a transparent glass substrate, and on which an OEL display 202 is disposed.

Referring to FIG. 9, a lamination plate 204 is provided by a lamination plate supply system. The material of the lamination plate includes glass, while a trench 206 is formed at an edge thereof to prevent overflow of the sealing agent 208 after a subsequent lamination process. The trench 206 on the lamination plate 204 has a width of about 0.05 mm to about 1.5 mm, and a depth of about 0.01 mm to about 1.7 mm. The method for forming the trench 206 includes sand shot, turnery, supersonic drill or chemical etching. In addition, the arrangement of the trench 206 includes a continuous frame (as shown in FIG. 7A), or several broken straight ditches (as shown in FIGS. 7B and 7C). In an alignment and lamination system, the lamination plate 204 is reversed to align with the panel 200. The alignment method includes mechanical alignment or using an optical charge-couple device.

A sealing agent 208 is coated on the lamination plate 204 using a sealing agent coating system. For example, a syringe is used to extrude a certain amount of the sealing agent 208 on the lamination plate 204. The pattern of the extruded sealing agent 208 includes dots, circles, rectangles, parallel stripes, cross lines, or a tree-like pattern (as shown in FIGS. 6A to 6F). The operation mechanism of the syringe includes gas adjustment or screw thrusting. The sealing agent 208 includes an UV curing resin or a thermal curing resin. By squeezing one or more syringes of the sealing agent coating system, the sealing agent 208 is coated on a surface of the lamination plate 204. Thereby, the amount of the sealing agent 208 can be precisely controlled, while the coated sealing agent 208 does not contain bubbles on a surface thereof to affect the package reliability of the OEL display 202.

Referring to FIG. 5, after the alignment of the lamination plate 204 and the panel 200, a sealing agent curing system is used to cure the UV or thermal curing resin after lamination of the lamination plate 204 and the panel 200. When a UV curing resin is selected, a UV radiation is applied thereon. When a thermal curing resin is used, a thermal process is performed.

Accordingly, the package method for organic electro-luminescent display provided by the invention has following advantages.

1. The global distribution of the UV or thermal curing resin enhances the adhesion between the UV or thermal curing resin, the panel and the lamination plate, the width of the UV or thermal curing resin between the device and the external, and the device lifetime by increasing width between the device and the external, which reduce the possibility for moisture permeation.

2. A syringe is used to coat the UV or thermal curing resin on the OEL display to prevent bubbles from generating at the junction between the UV or thermal curing resin and the OEL display.

3. A syringe is used to coat the UV or thermal curing resin on the OEL display, so that the problem of not being able to apply an inert gas environment due to the frequent cleaning requirement are resolved.

4. The package method of OEL display can be applied to the current package equipment without increasing any accessory thereof.

Other embodiments of the invention will appear to those skilled in the art from consideration of the specification and practice of the invention disclosed herein. It is understood that the specification and examples are to be considered as exemplary only, with a true scope and spirit of the invention being indicated by the following claims.

What is claimed is:

1. A package method for an organic electro-luminescent display, applicable under an inert gas environment, the package method comprising at least:

providing a panel, on which an organic electro-luminescent display is disposed;

providing a lamination plate, which has at least one trench formed at an edge thereon;

forming a frame sealant interposed between the panel and the lamination plate; and performing an alignment and lamination process on the panel and the lamination plate.

2. The package method according to claim 1, wherein the step of forming the frame sealant includes coating a sealing agent on the panel.

3. The package method according to claim 1, wherein the step of forming the frame sealant includes coating a sealing agent on the lamination plate.

4. The package method according to claim 1, further comprising a step of controlling an amount of a sealing agent by gas pressure adjustment for forming the frame sealant.

5. The package method according to claim 1, further comprising a step of controlling an amount of a sealing agent by screw thrusting for forming the frame sealant.

6. The package method according to claim 1, wherein a UV curing resin is used for forming the frame sealant.

7. The package method according to claim 6, further comprising a step of radiating ultra-violet light to cure the UV curing resin during the step of performing the alignment and lamination process.

8. The package method according to claim 7, further comprising a step of performing a thermal process to cure the thermal curing resin during the step of performing the alignment and lamination process.

9. The package method according to claim 1, wherein a thermal curing resin is used for forming the frame sealant.

10. The package method according to claim 1, further comprising coating a sealing agent with a pattern of dots, circles, rectangles, parallel strips, cross lines or a tree-like pattern for forming the frame sealant.

11. The package method according to claim 1, wherein the step of providing the lamination plate further comprises forming the trench in a form of a continuous frame.

12. The package method according to claim 1, wherein the step of providing the lamination plate further comprises forming the trench in a form of multiple broken straight trenches.

13. The package method according to claim 1, wherein the alignment process further comprises using a mechanical alignment or an optical charge-coupled device alignment.

14. A package apparatus for an organic electroluminescent display, comprising at least:

a panel supply system, to provide a panel comprising an organic electroluminescent display thereon;

a sealing agent coating system, to interpose a certain amount of a sealing agent between the panel and a lamination plate;

a lamination plate supply system including a supply of lamination plates, said lamination plates each comprising a trench formed at a periphery thereon;

an alignment and lamination system, to align and laminate the lamination plate and the panel; and a curing system, to cure the sealing agent.

15. The package apparatus according to claim 14, wherein the sealing agent is coated on the panel by the sealing agent coating system.

16. The package apparatus according to claim 14, wherein the sealing agent is coated on the lamination plate by the sealing agent coating system.

17. The package apparatus according to claim 14, wherein the sealing agent comprises a UV curing resin.

18. The package apparatus according to claim 17, wherein the UV curing resin is cured by ultra-violet radiation.

19. The package apparatus according to claim 14, wherein the sealing agent comprises a thermal curing resin.

20. The package apparatus according to claim 19, wherein the thermal curing resin is cured by a thermal process.

* * * * *